US012581782B2

(12) United States Patent
Zhang

(10) Patent No.: US 12,581,782 B2
(45) Date of Patent: Mar. 17, 2026

(54) DISPLAY PANELS AND METHODS OF MANUFACTURING A DISPLAY PANEL

(71) Applicant: Guangzhou China Star Optoelectronics Semiconductor Display Technology Co., LTd., Guangdong (CN)

(72) Inventor: Yi Zhang, Guangdong (CN)

(73) Assignee: GUANGZHOU CHINA STAR OPTOELECTRONICS SEMICONDUCTOR DISPLAY TECHNOLOGY CO., LTD., Guangzhou (CN)

( * ) Notice: Subject to any disclaimer, the term of this patent is extended or adjusted under 35 U.S.C. 154(b) by 372 days.

(21) Appl. No.: 18/344,709

(22) Filed: Jun. 29, 2023

(65) Prior Publication Data
US 2024/0332472 A1 Oct. 3, 2024

(30) Foreign Application Priority Data
Mar. 30, 2023 (CN) .......................... 202310334793.X

(51) Int. Cl.
*H01L 33/32* (2010.01)
*G09G 3/32* (2016.01)
(Continued)

(52) U.S. Cl.
CPC ............. *H10H 20/857* (2025.01); *G09G 3/32* (2013.01); *H01L 25/167* (2013.01);
(Continued)

(58) Field of Classification Search
CPC .. H10H 20/857; H10H 20/0364; H10H 20/01;
H10H 29/142; H10H 29/10; H10H 29/30;
H01L 25/167; H01L 25/16; H01L
25/0753; H10D 86/441; H10D 86/40;
H10D 86/60; H10D 86/421; G09G 3/32;
G09G 3/20; G09G 3/3233; G09G
2320/0233; G09G 2320/0439; G09G
2320/0861; G09G 2320/0223; G09F 9/33;
G09F 9/30;
(Continued)

(56) References Cited

U.S. PATENT DOCUMENTS 10,796,636 B2 * 10/2020 Kim ...................... G09G 3/3266
10,908,465 B2 * 2/2021 Zeng ...................... G02F 1/1368
(Continued)

*Primary Examiner* — Nikolay K Yushin
(74) *Attorney, Agent, or Firm* — PV IP PC; Christopher S. Ruprecht; Wei Te Chung

(57) ABSTRACT

A display panel includes a first display region and a second display region, wherein power supply lines and signal lines are arranged in each of the first and second display regions, each first sub-pixel is disposed in the first display region and electrically connected to the power supply line and the signal line, each second sub-pixel is disposed in the second display region and electrically connected to the power supply line and the signal line, in the second display region, an orthographic projection of the signal lines at least partially overlaps with that of the power supply lines, and when the display panel is in operation, a current difference between a first value of a first current flowing through a first thin film transistor and a second value of a second current flowing through a second thin film transistor is less than a preset threshold.

10 Claims, 7 Drawing Sheets

(51) Int. Cl.

| | |
|---|---|
| *H01L 25/16* | (2023.01) |
| *H01L 27/12* | (2006.01) |
| *H10D 86/40* | (2025.01) |
| *H10D 86/60* | (2025.01) |
| *H10H 20/857* | (2025.01) |
| *H10H 20/01* | (2025.01) |

(52) U.S. Cl.

CPC ........... *H10D 86/441* (2025.01); *H10D 86/60* (2025.01); *G09G 2320/0233* (2013.01); *H10H 20/0364* (2025.01)

(58) Field of Classification Search

CPC . G09F 9/335; G09F 9/301; G09F 9/00; G09F 9/302

See application file for complete search history.

(56) References Cited

U.S. PATENT DOCUMENTS

| | | | | |
|---|---|---|---|---|
| 12,361,874 | B2 * | 7/2025 | Yamada ............... | G09G 3/3233 |
| 2019/0155113 | A1 * | 5/2019 | Zeng ................. | G02F 1/136286 |
| 2019/0197949 | A1 * | 6/2019 | Kim ..................... | G09G 3/3233 |
| 2024/0029650 | A1 * | 1/2024 | Yamada .............. | H10K 59/131 |
| 2025/0118255 | A1 * | 4/2025 | Zhou ........................ | G09F 9/33 |

* cited by examiner

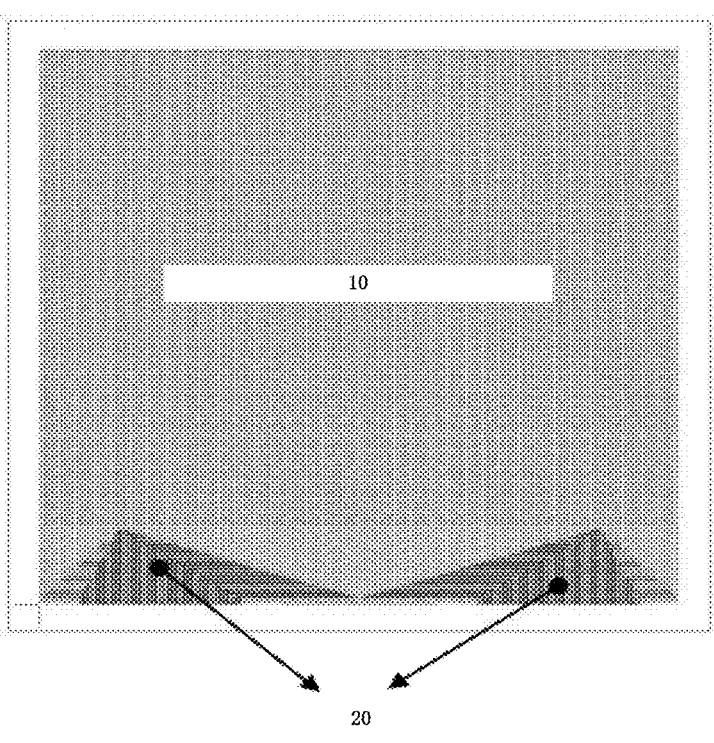

FIG. 5

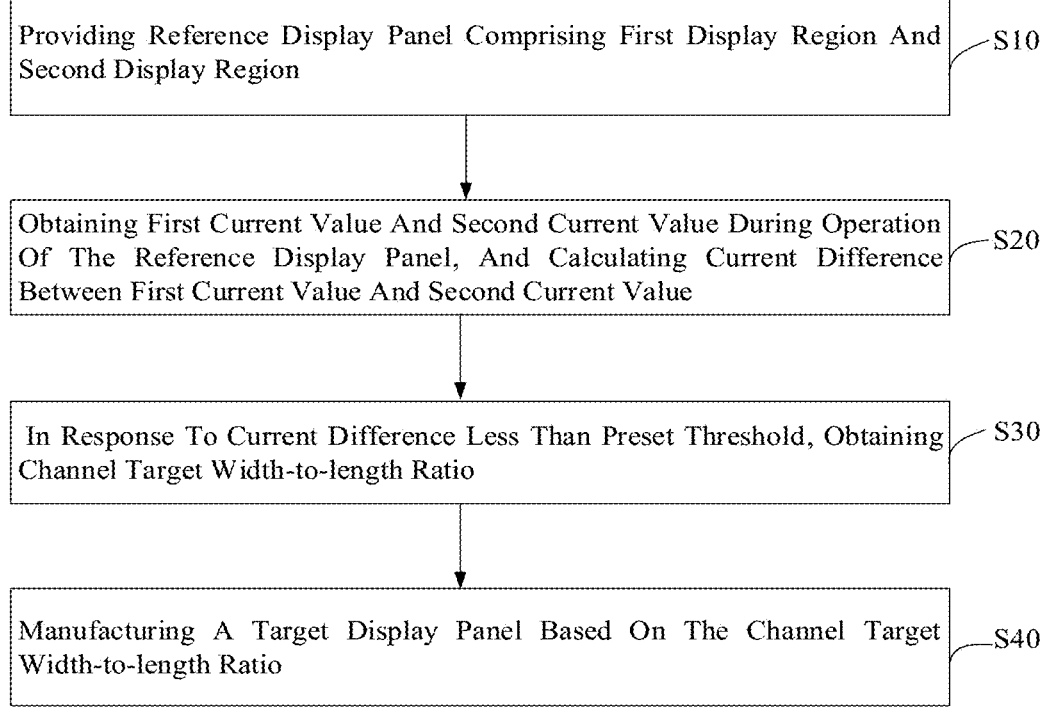

Providing Reference Display Panel Comprising First Display Region And Second Display Region ⟋S10

Obtaining First Current Value And Second Current Value During Operation Of The Reference Display Panel, And Calculating Current Difference Between First Current Value And Second Current Value ⟋S20

In Response To Current Difference Less Than Preset Threshold, Obtaining Channel Target Width-to-length Ratio ⟋S30

Manufacturing A Target Display Panel Based On The Channel Target Width-to-length Ratio ⟋S40

FIG. 6

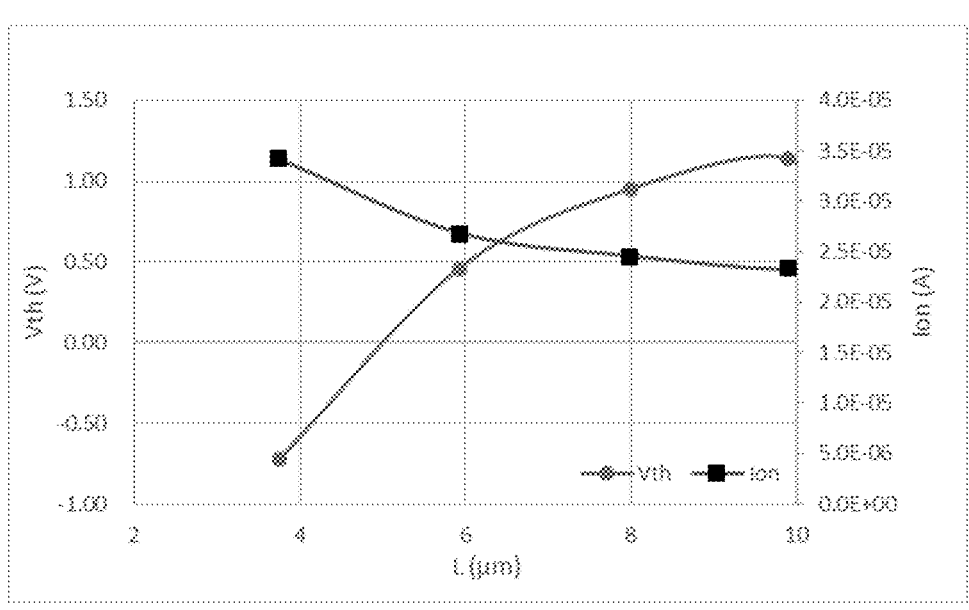

FIG. 7

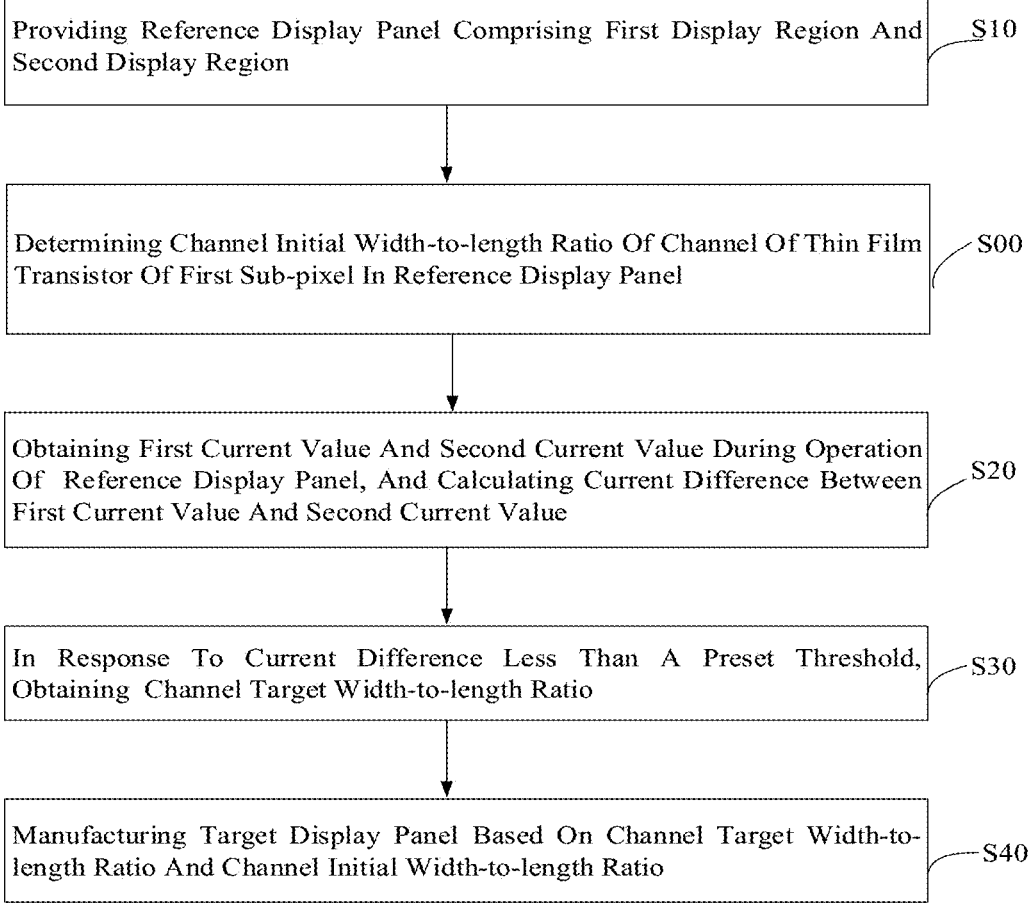

Providing Reference Display Panel Comprising First Display Region And Second Display Region     S10

Determining Channel Initial Width-to-length Ratio Of Channel Of Thin Film Transistor Of First Sub-pixel In Reference Display Panel     S00

Obtaining First Current Value And Second Current Value During Operation Of Reference Display Panel, And Calculating Current Difference Between First Current Value And Second Current Value     S20

In Response To Current Difference Less Than A Preset Threshold, Obtaining Channel Target Width-to-length Ratio     S30

Manufacturing Target Display Panel Based On Channel Target Width-to-length Ratio And Channel Initial Width-to-length Ratio     S40

FIG. 8

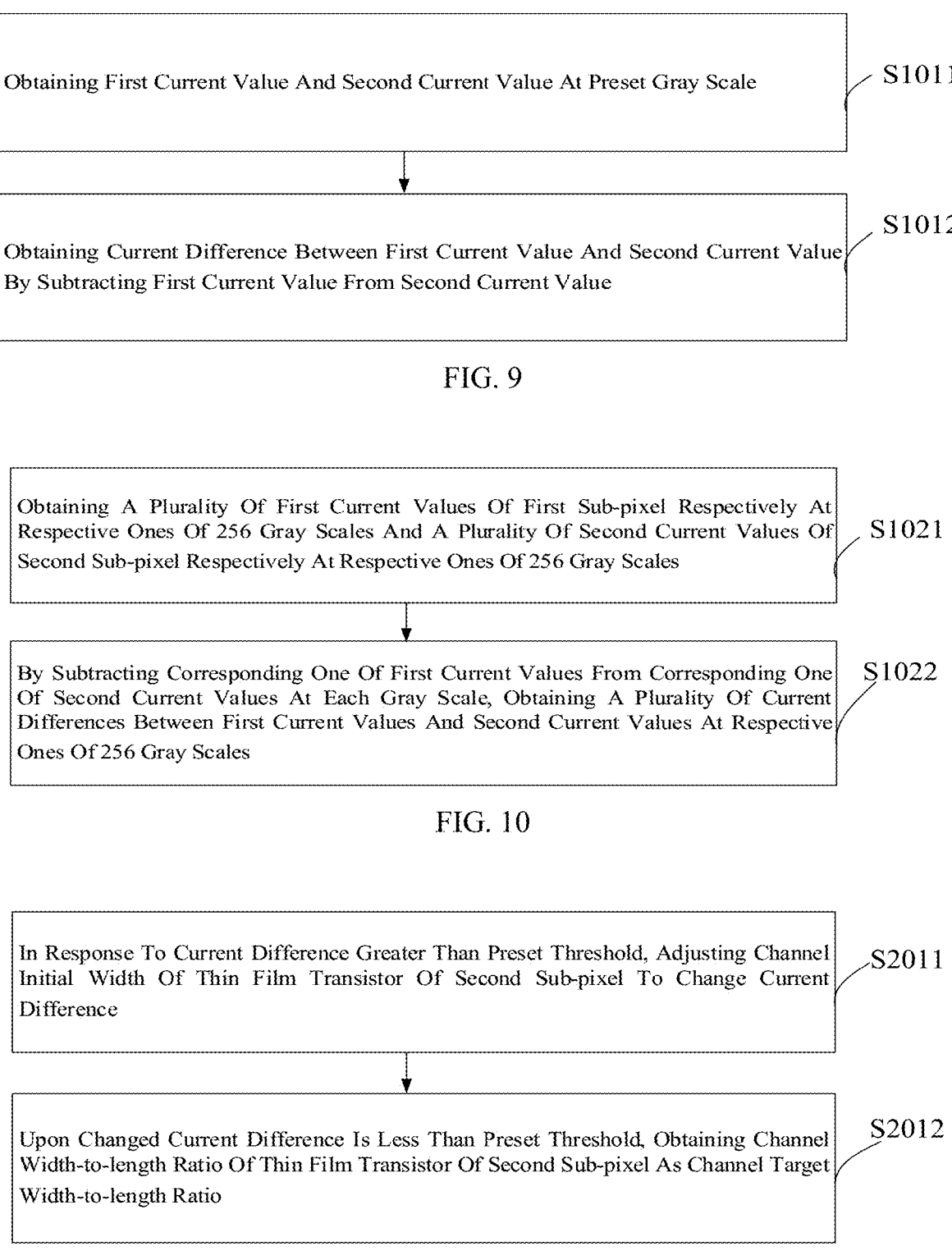

Obtaining First Current Value And Second Current Value At Preset Gray Scale     S1011

Obtaining Current Difference Between First Current Value And Second Current Value By Subtracting First Current Value From Second Current Value     S1012

FIG. 9

Obtaining A Plurality Of First Current Values Of First Sub-pixel Respectively At Respective Ones Of 256 Gray Scales And A Plurality Of Second Current Values Of Second Sub-pixel Respectively At Respective Ones Of 256 Gray Scales     S1021

By Subtracting Corresponding One Of First Current Values From Corresponding One Of Second Current Values At Each Gray Scale, Obtaining A Plurality Of Current Differences Between First Current Values And Second Current Values At Respective Ones Of 256 Gray Scales     S1022

FIG. 10

In Response To Current Difference Greater Than Preset Threshold, Adjusting Channel Initial Width Of Thin Film Transistor Of Second Sub-pixel To Change Current Difference     S2011

Upon Changed Current Difference Is Less Than Preset Threshold, Obtaining Channel Width-to-length Ratio Of Thin Film Transistor Of Second Sub-pixel As Channel Target Width-to-length Ratio     S2012

FIG. 11

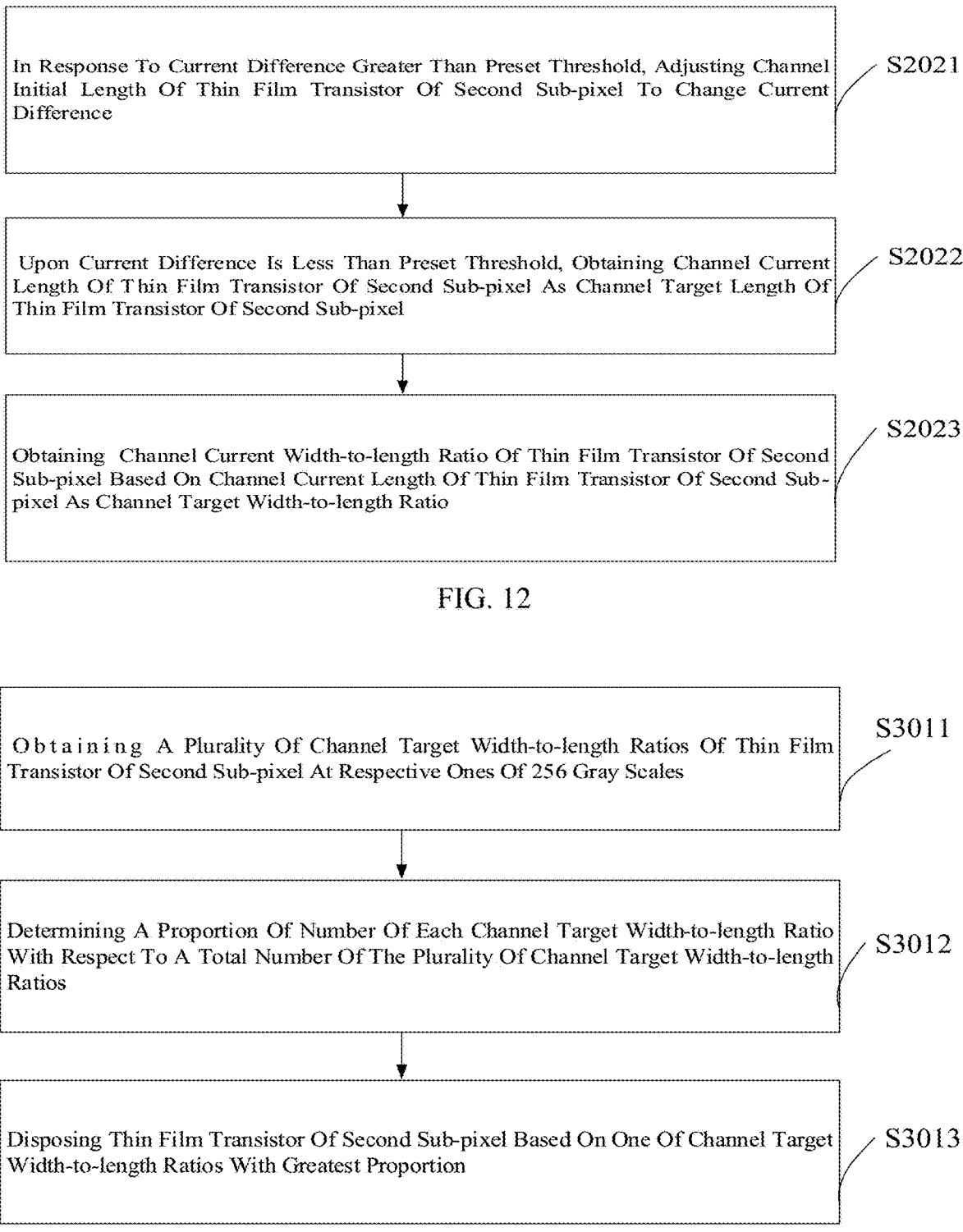

In Response To Current Difference Greater Than Preset Threshold, Adjusting Channel Initial Length Of Thin Film Transistor Of Second Sub-pixel To Change Current Difference — S2021

Upon Current Difference Is Less Than Preset Threshold, Obtaining Channel Current Length Of Thin Film Transistor Of Second Sub-pixel As Channel Target Length Of Thin Film Transistor Of Second Sub-pixel — S2022

Obtaining Channel Current Width-to-length Ratio Of Thin Film Transistor Of Second Sub-pixel Based On Channel Current Length Of Thin Film Transistor Of Second Sub-pixel As Channel Target Width-to-length Ratio — S2023

FIG. 12

Obtaining A Plurality Of Channel Target Width-to-length Ratios Of Thin Film Transistor Of Second Sub-pixel At Respective Ones Of 256 Gray Scales — S3011

Determining A Proportion Of Number Of Each Channel Target Width-to-length Ratio With Respect To A Total Number Of The Plurality Of Channel Target Width-to-length Ratios — S3012

Disposing Thin Film Transistor Of Second Sub-pixel Based On One Of Channel Target Width-to-length Ratios With Greatest Proportion — S3013

FIG. 13

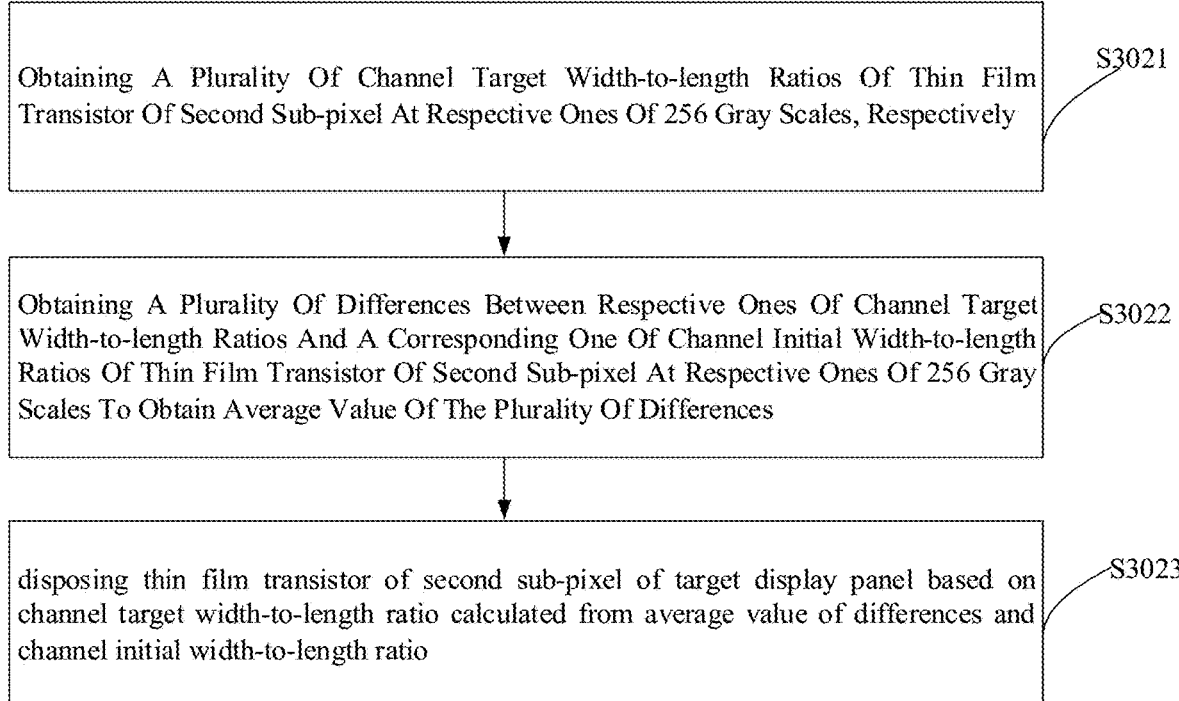

Obtaining A Plurality Of Channel Target Width-to-length Ratios Of Thin Film Transistor Of Second Sub-pixel At Respective Ones Of 256 Gray Scales, Respectively     S3021

Obtaining A Plurality Of Differences Between Respective Ones Of Channel Target Width-to-length Ratios And A Corresponding One Of Channel Initial Width-to-length Ratios Of Thin Film Transistor Of Second Sub-pixel At Respective Ones Of 256 Gray Scales To Obtain Average Value Of The Plurality Of Differences     S3022 disposing thin film transistor of second sub-pixel of target display panel based on channel target width-to-length ratio calculated from average value of differences and channel initial width-to-length ratio     S3023

FIG. 14

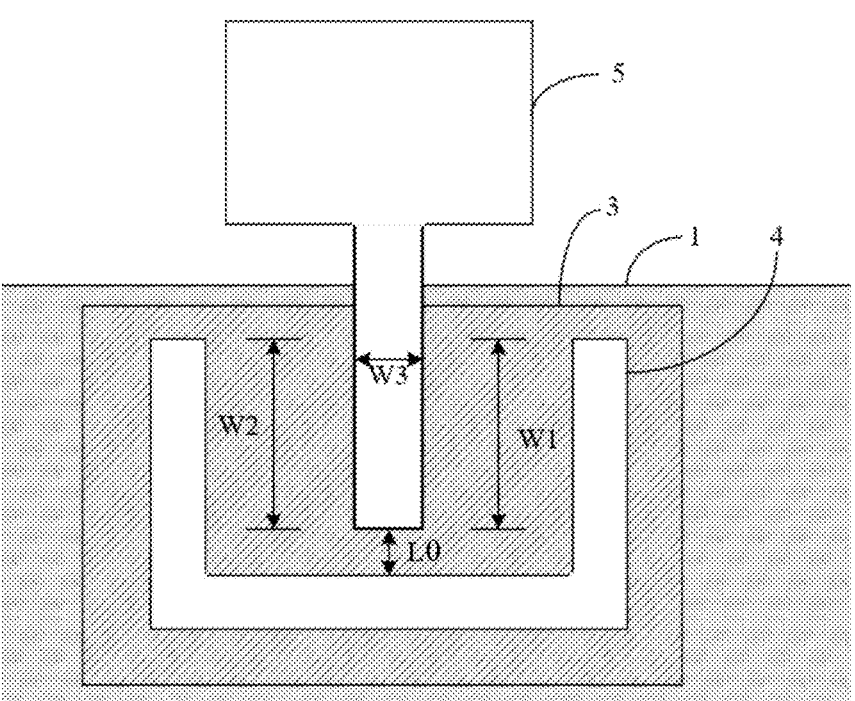

FIG. 15

DISPLAY PANELS AND METHODS OF MANUFACTURING A DISPLAY PANEL

CROSS-REFERENCE TO RELATED APPLICATION

This application claims priority to and the benefit of Chinese Patent Application No. 202310334793.X, filed on Mar. 30, 2023, the disclosure of which is incorporated herein by reference in its entirety.

TECHNICAL FIELD

The present application relates to display technologies, and in particular, to display panels and methods of manufacturing a display panel.

BACKGROUND

A Mini/Micro-LED (MLED for short) display has been rapidly developed in recent years, and the MLED has characteristics such as high contrast and high color rendering performance, and may be used in medium-sized and small-sized displays with high additional performance, thus becoming popular in display panel manufacturers.

However, due to size limitation of a narrow bonding seam in a display panel, fan-out lines of an MLED lamp board need to be arranged within a display region of the display panel because, if the fan-out lines are arranged outside the display region, a distance between light-emitting diodes at the seam may be excessively large. Thus, the fan-out lines may overlap power supply lines in the display region, resulting in parasitic capacitance. The fan-out lines are generally data signal lines. For a pixel at position where the power supply line meets the fan-out line, when the light-emitting diode in the pixel are lighted, due to a parasitic capacitance between the power supply line and the fan-out line such as the data signal line, potential of a data voltage transmitted through the fan-out line increase by coupling effect, thereby increasing current flowing through the light-emitting diode in the pixel. In this case, with a same data signal, a data voltage value of the pixel at a location where the power supply line overlaps the fan-out line is higher than a voltage value of the pixel at a location where the power supply line does not overlap the fan-out line, so that the luminance of the pixel at a location where the power supply line overlaps the fan-out line may be higher, thereby causing non-uniform luminance (or mura) of the display panel.

SUMMARY

In view of the above, an embodiment of the present application provides a display panel including: a first display region and a second display region, wherein power supply lines and signal lines are arranged in each of the first display region and the second display region, a plurality of first sub-pixels are disposed in the first display region, and each of the first sub-pixels is electrically connected to one of the power supply lines and one of the signal lines, a plurality of second sub-pixels are disposed in the second display region, and each of the second sub-pixels is electrically connected to one of the power supply lines and one of the signal lines, in the second display region, an orthographic projection of the signal lines at least partially overlaps with an orthographic projection of the power supply lines, and each of the first sub-pixels includes a first thin film transistor, each of the second sub-pixels includes a second thin film transistor, and the first thin film transistor and the second thin film transistor are configured such that, when the display panel is in operation, a current difference between a first value of a first current flowing through the first thin film transistor and a second value of a second current flowing through the second thin film transistor is less than a preset threshold.

Another embodiment of the present application provides a method of manufacturing a display panel including: providing a reference display panel having a first display region and a second display region adjacent to each other, wherein a plurality of first sub-pixels each including a first thin film transistor are disposed in the first display region, and a plurality of second sub-pixels each including a second thin film transistor are disposed in the second display region; obtaining, when the reference display panel is in operation, a first value of a first current flowing through the first thin film transistor and a second value of a second current flowing through the second thin film transistor, and calculating a current difference between the first value and the second value; obtaining a target ratio of a second width of a second channel of the second thin film transistor to a second length of the second channel by adjusting a ratio of the second width to the second length so that the current difference is less than a preset threshold; and manufacturing a target display panel having a target first display region and a target second display region adjacent to each other, so that a ratio of a target second width of a target second channel of a target second thin film transistor of each of target second sub-pixels disposed in the target second display region to a target second length of the target second channel is equal to the target ratio.

BRIEF DESCRIPTION OF THE DRAWINGS

FIG. 5 is a schematic diagram of a reference display panel with a non-uniform luminance.

FIG. 6 is a schematic flowchart of a method of manufacturing a display panel according to an embodiment of the present application.

FIG. 7 is a graph of a threshold voltage versus a channel length of the thin film transistor and the current flowing through the sub-pixel versus the channel length of the thin film transistor according to an embodiment of the present application.

FIG. 8 is a schematic flowchart of a method of manufacturing a display panel according to an embodiment of the present application.

FIG. 9 is a schematic flowchart of sub-steps of Step S20 in FIG. 6 according to an embodiment of the present application.

FIG. 10 is a schematic flowchart of sub-steps of Step S20 in FIG. 6 according to an embodiment of the present application.

FIG. 11 is a schematic flowchart of sub-steps of Step S30 in FIG. 6 according to an embodiment of the present application.

FIG. 12 is a schematic flowchart of sub-steps of Step S30 in FIG. 6 according to an embodiment of the present application.

FIG. 13 a schematic flowchart of sub-steps of Step S40 in FIG. 6 according to an embodiment of the present application.

FIG. 14 is a schematic flowchart of sub-steps of Step S40 in FIG. 6 according to an embodiment of the present application.

FIG. 15 is a schematic top view of a channel of a thin film transistor.

DETAILED DESCRIPTION

Some embodiments of the present application will be described in detail below with reference to the drawings. The embodiments are provided for illustrative purposes only, not intended to limit the scope of the present application.

An embodiment of the present application provides a display panel and a method of manufacturing a display panel. The method of manufacturing the display panel may improve non-uniform luminance of the display panel and improve the display effect. Detailed descriptions are given below. It should be noted that the order in which the following embodiments are described is not intended to limit a preferred order of the embodiments. In addition, in the description herein, the term "comprise/include" means "comprise/include, but not limited to" The terms "first," "second," "third," or the like are used merely as labels to distinguish between different objects and not to describe a particular order.

The term "if" is, optionally, construed to mean "when" or "upon" or "in response to determining" or "in response to detecting," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]," depending on the context.

Figure 1:
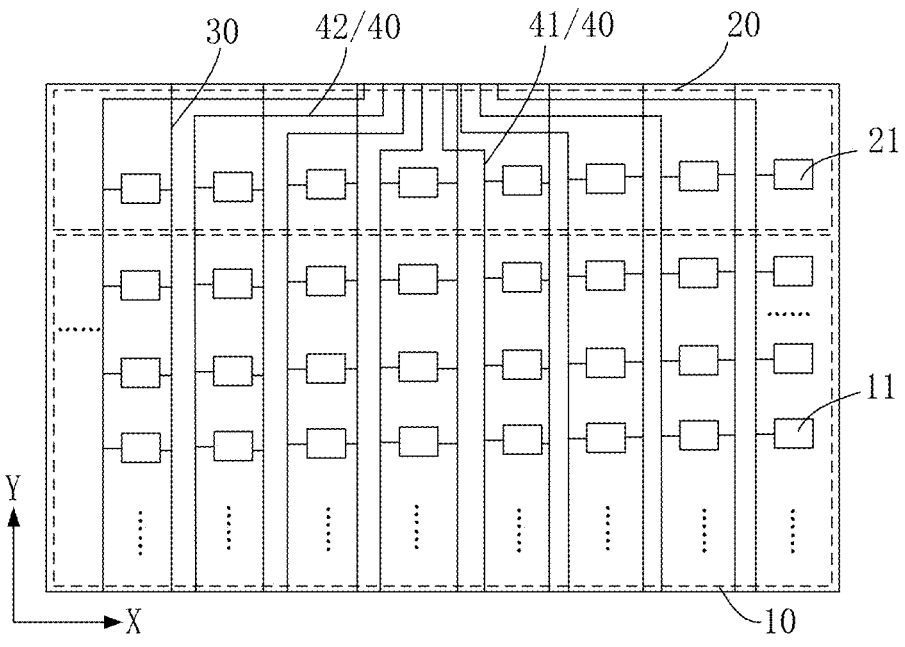
FIG. 1 is a schematic structural diagram of a reference display panel according to an embodiment of the present application.
Figure 2:
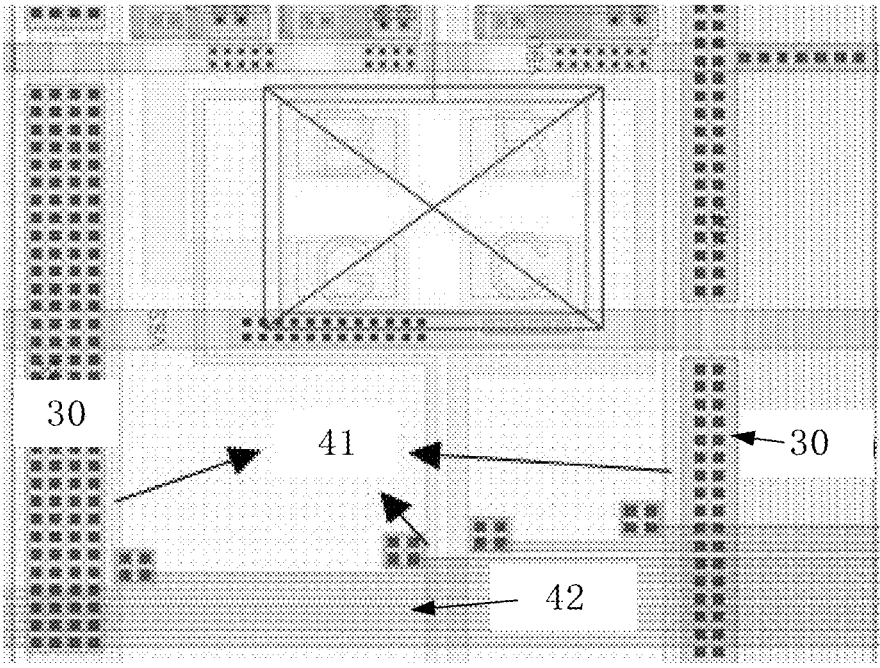
FIG. 2 is a top view of a reference display panel according to an embodiment of the present application.
Figure 3:
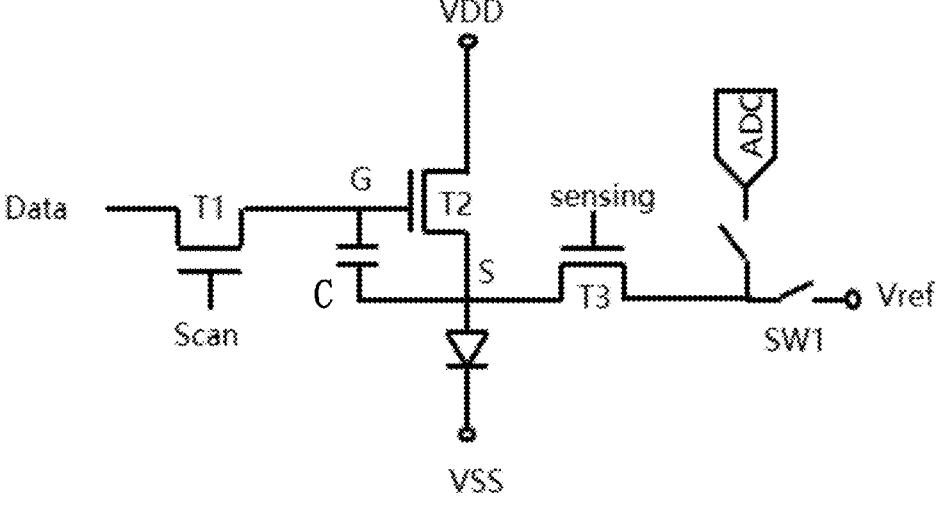
FIG. 3 is an equivalent circuit diagram of a first sub-pixel according to an embodiment of the present application.
Figure 4:
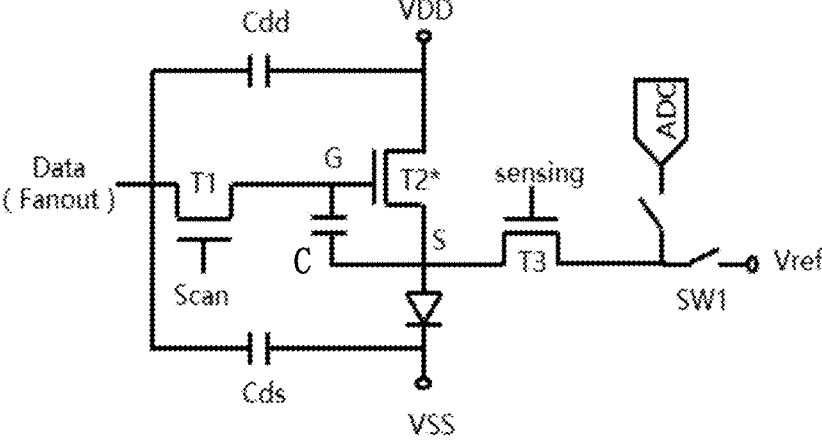
FIG. 4 is an equivalent circuit diagram of a second sub-pixel according to an embodiment of the present application.

FIG. 1 is a schematic structural diagram of a reference display panel according to an embodiment of the present application. FIG. 2 is a top view of a reference display panel according to an embodiment of the present application. FIG. 3 is an equivalent circuit diagram of a first sub-pixel according to an embodiment of the present application. FIG. 4 is an equivalent circuit diagram of a second sub-pixel according to an embodiment of the present application. FIG. 5 is a schematic diagram of a reference display panel with a non-uniform luminance.

In an embodiment of the present application, as shown in FIGS. 1 and 2, a plurality of first sub-pixels 11, power supply lines 30, and signal lines 40 are disposed in a first display region 10 of the reference display panel. Each of the first sub-pixels 11 is electrically connected to the power supply line 30 and the signal line 40, respectively. A plurality of second sub-pixels 21, the power supply lines 30, and the signal lines 40 are disposed in the second display region 20. Each of the second sub-pixel 21 is electrically connected to the power supply line 30 and the signal line 40, respectively. In the second display region 20, an orthographic projection of the signal line 40 at least partially overlaps an orthographic projection of the power supply line 30. A current difference between a first current value of a current flowing through the thin film transistor (e.g., T2 in FIG. 3) of the first sub-pixel 11 and a second current value of a current flowing through the thin film transistor (e.g., T2\* in FIG. 4) of the second sub-pixel 21 is less than a preset threshold during operation of the display panel.

In an embodiment of the present application, the power supply line 30 includes a first power supply line VDD for supplying a constant voltage of a high level and a second power supply line VSS for supplying a constant voltage of a low level. The power supply line 30 extends in a first direction Y, which may be a width direction of the display panel or a length direction of the display panel. In FIG. 1, the first direction Y is described as the width direction of the display panel as an example. The signal line 40 includes data signal lines Data. The signal line 40 includes a first connecting portion 41 extending in a first direction Y and a second connecting portion 42 extending in a second direction X. The first connecting portion 41 is disposed in the first display region 10 and extends to the second display region 20. The second connecting portion 42 is disposed in the second display region 20. An orthographic projection of the second connecting portion 42 at least partially overlaps an orthographic projection of the power supply line 30, so that parasitic capacitances Cdd and Cds are generated between the power supply line 30 and the second connecting portion 42 of the signal lines 40. The second direction X may be the width direction of the display panel or the length direction of the display panel. In FIG. 1, the second direction X is described the width direction of the display panel as an example.

In an embodiment of the present application, a channel of a thin film transistor of the first sub-pixel may have a channel width-to-length ratio different from that of a corresponding thin film transistor of the second sub-pixel. A channel length of the thin film transistor of the second sub-pixel may be greater than a channel length of the thin film transistor of the first sub-pixel. Further, a channel width of the thin film transistor of the second sub-pixel may be same as a channel width of the thin film transistor of the first sub-pixel.

In an embodiment of the present application, the channel of the thin film transistor of the first sub-pixel may have a channel width-to-length ratio (or channel width-to-length ratio) different from that of the corresponding thin film transistor of the second sub-pixel. The channel width of the thin film transistor of the second sub-pixel may be smaller than the channel width of the thin film transistor of the first sub-pixel. Further, the channel width of the thin film transistor of the second sub-pixel may be same as or different from the channel width of the thin film transistor of the first sub-pixel, as long as the current difference between the first current value of the current flowing through the thin film transistor of the first sub-pixel 11 and the second current value of the current flowing through the thin film transistor of the second sub-pixel 21 is less than or equal to the preset threshold during operation of the display panel.

In an embodiment of the present application, the channel of the thin film transistor of the first sub-pixel may have a channel width-to-length ratio (or width/length ratio) different from that of the corresponding thin film transistor of the second sub-pixel, so that the first current value may be equal to the second current value. In this case the preset threshold may be zero.

In an embodiment of the present application, the thin film transistor of the first sub-pixel or the thin film transistor of the second sub-pixel may have a structure as shown in FIG. 15. The thin film transistor overlaps the scan signal line 1. The thin film transistor includes a source 5, a semiconductor layer 3, and a drain 4. The channel width of the thin film transistor may be a sum of W1, W2, and W3. The channel length of the thin film transistor may be L0. The channel width-to-length ratio of the thin film transistor may be (W1+W2+W3)/L0.

Specifically, as shown in FIG. 3, the first sub-pixel 11 includes a first transistor T1, a second transistor T2, a third transistor T3, a capacitor C, and a switch SW1. A gate of the first transistor T1 is electrically connected to a scan signal line Scan. One of a source and a drain of the first transistor T1 is electrically connected to the data signal line Data. The other of the source and drain of the first transistor T1 is electrically connected to a first node G. A gate of the second transistor T2 is electrically connected to the first node G. One of a source and a drain of the second transistor T2 is electrically connected to a first power supply line VDD. The other of the source and the drain of the second transistor T2 is electrically connected to a second node S. One terminal of the capacitor C is electrically connected to the first node G. The other terminal of the capacitor C is electrically connected to the second node S. A gate of the third transistor T3 is electrically connected to a sense signal line Sensing. One of the source and the drain of the second transistor T2 is electrically connected to one end of the switch SW1. The other of the source and the drain of the second transistor T2 is electrically connected to the second node S. One end of the switch SW1 is further electrically connected to an ADC circuit. The other end of the switch SW1 is electrically connected to a reference signal line Vref.

As shown in FIG. 4, a configuration of the second sub-pixel 21 is similar with that of the first sub-pixel 11, except that the second sub-pixel 21 further incudes a parasitic capacitance Cdd between the first power supply terminal VDD of the second sub-pixel 21 and the data signal line Data and a parasitic capacitance Cds between the second power supply terminal VSS of the second sub-pixel 21 and the data signal line Data.

In a display stage of the display panel, ones of the second sub-pixels 21 close to the second connection portion 42 of the signal line 40 are effected by the parasitic capacitances. That is, potential of a data voltage Vdata transmitted through the second connection portion 42 of the signal line 40 increases by coupling effect due to the parasitic capacitances Cdd and Cds between the power source line 30 and the second connection portion 42 of the signal line 40, resulting in an increase in the current flowing through the second sub-pixel 21. Therefore, for the same data signal Data, the data voltage Vdata of the second sub-pixel 21 close to the second connection portion 42 of the signal line 40 is higher than that of the first sub-pixel 11 far away from the second connection portion 42 of the signal line 40, i.e., luminance of the second sub-pixel 21 close to the second connection portion 42 of the signal line 40 is higher than that of the first sub-pixel 11 far away from the second connection portion 42 of the signal line 40, thereby causing non-uniform luminance of the display panel, as shown in FIG. 5.

In view of the above, the method of manufacturing the display panel according to an embodiment of the present application may control the current flowing through the second sub-pixel 21 by configuring the thin film transistor of the first sub-pixel and the thin film transistor of the second sub-pixel, thereby improving the non-uniform luminance of the display panel and improving the display effect.

FIG. 6 is a schematic flowchart of a method of manufacturing a display panel according to an embodiment of the present application. The present application provides a method of manufacturing a display panel. As shown in FIG. 6, the method of manufacturing the display panel includes Step S10, Step S20, Step S30, and Step S40.

At step S10, provided is a reference display panel including a first display region 10 and a second display region 20 disposed adjacent with each other. A plurality of first sub-pixels 11 each comprising a first thin film transistor is disposed in the first display region 10. A plurality of second sub-pixels 21 each comprising a second thin film transistor is disposed in the second display region 20.

Specifically, the channel of each of the thin film transistors of the first sub-pixel 11 and the second sub-pixel 21 has a channel initial width-to-length ratio. The luminance of the first sub-pixel or the luminance of the second sub-pixel is mainly related to the current flowing through the first or second sub-pixel. In addition, with reference to FIG. 7 showing a graph of the threshold voltage versus the channel length of the thin film transistor and the current flowing through the sub-pixel versus the channel length of the thin film transistor according to an embodiment of the present application, the current flowing through the sub-pixel is related to the threshold voltage of the thin film transistor. Therefore, the current flowing through the sub-pixel may be changed by adjusting the threshold voltage of the thin film transistor, thereby adjusting the luminance of the display panel.

At Step S20, a first current value of a current flowing through the thin film transistor of the first sub-pixel 11 and a second current value of a current flowing through the thin film transistor of the second sub-pixel 21 is obtained when the reference display panel is in operation, and a current difference between the first current value and the second current value is calculated.

In an embodiment of the present application, the second sub-pixel 21 in the second display region 20 is affected by the parasitic capacitances Cdd and Cds between the power supply line 30 and the second connection portion 42 of the signal line 40, so that the second current value is larger than the first current value, and the luminance of the second display region 20 is higher than that of the first display region 10. Thus, by obtaining the first and second current values and comparing them, the current difference between the first current value and the second current value is obtained, to determine the influence of the parasitic capacitances Cdd and/or Cds on the second sub-pixel 21. Further, the second current value tends to be same as the first current value by reducing the second current value of the second sub-pixel 21, so that the luminance of the first sub-pixel 11 is substantially same as the second sub-pixel 21.

At Step S30, a channel target width-to-length ratio of the channel of the thin film transistor of the second sub-pixel 21 (that is, a target ratio of a width of a channel of the second thin film transistor to a length of the channel of the second thin film transistor) is obtained by adjusting a ratio of the width of the channel of the second thin film transistor to the length of the channel of the second thin film transistor so that the current difference is less than a preset threshold.

In an embodiment of the present application, the relationship between the current value I and the channel width-to-length ratio W/L of the channel of the thin film transistor is as follows:

$$I = \frac{1}{2} * \mu * Cox * \frac{W}{L} * (V_{gs} - V_{th}),$$

where I represents the second current value, u represents the mobility, Cox represents the capacitance of the thin film transistor, W represents the channel width of the thin film transistor, L represents the channel length of the thin film transistor, Vgs represents the gate-source voltage of the thin film transistor, and Vth represents the threshold voltage of the thin film transistor.

In an embodiment of the present application, the current difference between the first current value I1 and the second current value I2 is obtained by equation $\Delta I=I2-I1$. A variation $\Delta(W/L)$ of the channel width-to-length ratio of the channel of the thin film transistor of the second sub-pixel 21 is obtained based on the current difference $\Delta I$. Assume that the channel initial width-to-length ratio of the channel of the thin film transistor of the second sub-pixel 21 is W1/L1 and the channel target width-to-length ratio of the channel of the thin film transistor of the second sub-pixel 21 is W2/L2, the variation of the channel width-to-length ratio of the channel is $\Delta(W/L)=W1/L1-W2/L2$.

For example, if the channel initial width-to-length ratio of the channel is W1/L1=1/10 and the variation $\Delta(W/L)$ of the channel width-to-length ratio of the channel is 1/30, the calculated channel target width-to-length ratio of the channel is W2/L2=1/15.

In an embodiment of the present application, by reducing the channel width-to-length ratio of the thin film transistor of the second sub-pixel 21 and increasing the threshold voltage of the driving thin film transistor in the second sub-pixel 21, the second current value of the second sub-pixel 21 in the second display region 20 is reduced. The threshold voltage of the driving thin film transistor is affected by the process and the device configuration. Under the condition that the process is determined, the threshold voltage may be adjusted by improving the configuration of the second sub-pixel 21 in the second display region 20. In an embodiment of the present application, by adjusting the channel length of the driving thin film transistor and/or the channel width, that is, by adjusting the channel width-to-length ratio of the driving thin film transistor, the threshold voltage of the driving thin film transistor is adjusted. In an embodiment, the channel length of the driving thin film transistor is adjusted to adjust the threshold voltage of the driving thin film transistor. The larger the channel length of the driving thin film transistor is, the greater the threshold voltage is. Therefore, as shown in FIG. 7, by slightly increasing the channel length of the driving transistor in the second sub-pixel 21 in the second display region 20, the channel width-to-length-ratio thereof may be reduced and the threshold voltage thereof may be increased, the current flowing through the second sub-pixel 21 in the second display region 20 may be reduced, so that the luminance of the sub-pixel in the second display region 20 may tend to be same as that of the sub-pixel in the first display region 10, thereby improving the non-uniform luminance of the display panel.

After the channel target width-to-length ratio of the channel of the thin film transistor of the second sub-pixel is obtained by the above calculation, Step S40 of configuring a target display panel according to the channel target width-to-length ratio of the channel is performed. The channel width-to-length ratio of the channel of the thin film transistor of the second sub-pixel in the target display panel is same as the channel target width-to-length ratio.

In an embodiment of the present application, the channel width-to-length ratio of the channel of the thin film transistor of the second sub-pixel 21 is adjusted from W1/L1 to W2/L2, and then the thin film transistor of the second sub-pixel 21 is manufactured according to the channel target width-to-length ratio W2/L2, respectively, while the thin film transistor of the first sub-pixel 11 is manufactured according to the channel initial width-to-length ratio W1/L1 to obtain an improved display panel.

It should be noted that the type of the reference display panel is same as the type of the target display panel according to an embodiment of the present application. Except that the channel width-to-length ratio of the channel of the thin film transistor in the second display region 20 of the reference display panel is different from that of the target display panel, other parameters, sizes, materials, or the like of the reference display panel is same as that of the target display panel.

FIG. 8 is a schematic flowchart of a method of manufacturing a display panel according to an embodiment of the present application. As shown in FIG. 8, the manufacturing method further includes: Step S00 before Step S20.

At Step S00, a channel initial width-to-length ratio of the channel of the thin film transistor of the first sub-pixel 11 in the reference display panel is determined. The channel initial width-to-length ratio of the channel of the thin film transistor of the first sub-pixel 11 is equal to a channel initial width-to-length ratio of the channel of the thin film transistor of the second sub-pixel 21.

Specifically, after determining the reference display panel, it is necessary to first determine the channel initial width-to-length ratio of the channel of the thin film transistor of the first sub-pixel 11 and the channel initial width-to-length ratio of the channel of the thin film transistor of the second sub-pixel 21 in the reference display panel.

The channel initial width-to-length ratio of the channel of the thin film transistor of the first sub-pixel 11 and the channel initial width-to-length ratio of the channel of the thin film transistor of the second sub-pixel 21 may be obtained by referring to a design manual of the reference display panel. Alternatively, the reference display panel may be powered on, and the channel initial width-to-length ratio of the channel of the thin film transistor of the first sub-pixel 11 may be calculated by detecting the current flowing through the thin film transistor of the first sub-pixel 11.

Alternatively, the channel initial width-to-length ratio of the channel of the thin film transistor of the first sub-pixel 11 and the channel initial width-to-length ratio of the channel of the thin film transistor of the second sub-pixel 21 may be same or may be different, and is not limited herein.

FIG. 9 is a schematic flowchart of sub-steps of Step S20 in FIG. 6 according to an embodiment of the present application. Step S20 includes Sub-step S1011 and sub-step S1012.

At Sub-step S1011, a first current value of a current flowing through the thin film transistor of the first sub-pixel 11 and a second current value of a current flowing through the thin film transistor of the second sub-pixel are respectively obtained at a preset gray scale.

In an embodiment of the present application, the preset gray scale may take one or more gray scale values in a range of zero to 255. Specifically, the second current value I2 of the second sub-pixel 21 is larger than the first current value I1 of the first sub-pixel 11.

At Sub-step S1012, by subtracting the first current value from the second current value, a current difference between the first current value and the second current value is obtained.

In an embodiment of the present application, the current difference is $\Delta I=I2-I1$, and the variation $\Delta(W/L)$ of the channel width-to-length ratio calculated based on the current difference $\Delta I$ is greater than zero. Since the channel target width-to-length ratio W2/L2 is obtained by subtracting the channel width-to-length ratio variation $\Delta(W/L)$ from the channel initial width-to-length ratio W1/L1, the channel target width-to-length ratio W2/L2 is smaller than the channel initial width-to-length ratio W1/L1.

In an embodiment of the present application, reference is made to FIG. 10, which is a schematic flowchart of sub-steps of Step S20 in FIG. 6 according to an embodiment of the present application. Step S20 includes Sub-step S1021 and Sub-step S1022.

At Sub-step S1021, a plurality of first current values of the first sub-pixel 11 respectively at respective ones of 256 gray scales are obtained and a plurality of second current values of the second sub-pixel 21 respectively at the respective ones of 256 gray scales are obtained.

In an embodiment of the present application, a plurality of first current values of the first sub-pixel 11 respectively at the gray scale 0 to the gray scale 255 may be obtained, and a plurality of second current values of the second sub-pixel 21 respectively at the gray scale 0 to the gray scale 255 may be obtained.

At Sub-step S1022, by subtracting the first current value from the second current value at each of the gray scales, a plurality of current differences corresponding to the first current values and the second current values at respective ones of 256 gray scales are obtained.

In an embodiment of the present application, the current difference between the first current value and the second current value at each of the gray scales is obtained. Further, the degree of influence of the parasitic capacitances Cdd and Cds on the second current value of the second sub-pixel 21 at different gray scales may be obtained.

FIG. 11 is a schematic flowchart of sub-steps of Step S30 in FIG. 6. Step S30 includes Sub-steps S2011 and S2012.

At Sub-step S2011, in response to the current difference greater than the preset threshold, the channel initial width of the thin film transistor of the second sub-pixel 21 is adjusted to change the current difference.

Specifically, the current difference between the first current value I1 and the second current value I2 is $\Delta I = I2 - I1$. The variation $\Delta(W/L)$ of the channel width-to-length ratio of the thin film transistor of the second sub-pixel 21 is obtained based on the current difference $\Delta I$. Assume that the channel initial width-to-length ratio of the channel of the thin film transistor of the second sub-pixel 21 is W1/L1 and the channel target width-to-length ratio of the channel of the thin film transistor of the second sub-pixel 21 is W2/L2, the variation of the channel width-to-length ratio of the channel is $\Delta(W/L) = W1/L1 - W2/L2$.

At Sub-step S2012, upon the current difference is less than a preset threshold, the channel current width-to-length ratio of the thin film transistor of the second sub-pixel 21 is obtained as the channel target width-to-length ratio of the thin film transistor of the second sub-pixel 21.

In an embodiment of the present application, the preset threshold may be 0. In the case, the first current value of the first sub-pixel 11 may be same as the second current value of the second sub-pixel 21, and the luminance of the first sub-pixel 11 may be same as the luminance of the second sub-pixel 21. In an embodiment of the present application, the preset threshold may not be 0. In this case, in response to the current difference less than a preset threshold, the channel current width-to-length ratio of the thin film transistor of the second sub-pixel 21 is obtained as the channel target width-to-length ratio of the thin film transistor of the second sub-pixel 21, as long as a current difference between the first current value and the second current value does not cause a significant luminance difference between the first sub-pixel 11 and the second sub-pixel 21.

In an embodiment of the present application, after calculating the variation of the channel width-to-length ratio of the thin film transistor of the second sub-pixel 21, determine the channel length and the channel width of the thin film transistor of the second sub-pixel 21 are determined based on the variation of the channel width-to-length ratio, respectively.

Specifically, according to the variation of the channel width-to-length ratio, the channel length of the thin film transistor may be adjusted, or the channel width of the thin film transistor may be adjusted, or both the channel length and the channel width of the thin film transistor may be adjusted. In an embodiment, an example in which the channel length of the thin film transistor is adjusted according to the variation of the channel width-to-length ratio is provided.

In the case that only the channel length of the thin film transistor is adjusted according to the variation of the channel width-to-length ratio, the channel width of the thin film transistor remains unchanged. The channel length of the thin film transistor of the second sub-pixel 21 is obtained according to the channel initial width and the channel width-to-length ratio. In the case that only the channel width of the thin film transistor is adjusted according to the variation of the channel width-to-length ratio, the channel length of the thin film transistor remains unchanged, and the channel width of the thin film transistor of the first sub-pixel 11 is obtained according to the channel initial length and the variation of the channel width-to-length ratio. In the case that the channel length and the channel width of the thin film transistor both are adjusted according to the variation of the channel width-to-length ratio, the adjustment is made on the channel initial length and the channel initial width, respectively, so that the adjusted channel width-to-length ratio is same as the channel target width-to-length ratio.

For example, if the channel initial width-to-length ratio W1/L1 is 1/10 and the variation $\Delta(W/L)$ of the channel width-to-length ratio is 1/30, the calculated channel target width-to-length ratio W2/L2 is 1/15, the channel initial width of the thin film transistor is 1 μm, and the channel initial length is 10 μm. Under the condition that only the channel length of the thin film transistor is adjusted, it is necessary to adjust the channel length of the thin film transistor from the channel initial length of 10 μm to 15 μm.

FIG. 12 is a schematic flowchart of sub-steps of Step S30 in FIG. 6. Step S30 includes Sub-step S2021 and Sub-step S2022.

At Sub-step S2021, in response to the current difference greater than the preset threshold, the channel initial length of the thin film transistor of the second sub-pixel 21 is adjusted to change the current difference.

In an embodiment, the current difference between the first current value I1 and the second current value I2 is $\Delta I = I2 - I1$. The variation $\Delta(W/L)$ of the channel width-to-length ratio of the thin film transistor of the second sub-pixel 21 is obtained based on the current difference $\Delta I$. Assume that the channel initial width-to-length ratio of the channel of the thin film transistor of the second sub-pixel 21 is W1/L1 and the channel target width-to-length ratio of the channel of the thin film transistor of the second sub-pixel 21 is W2/L2, the variation of the channel width-to-length ratio of the channel is $\Delta(W/L) = W1/L1 - W2/L2$. In an embodiment, the width of the thin film transistor of the second sub-pixel 21 is kept unchanged, that is, W1=W2, and L2 is adjusted to L1+L.

At Sub-step S2022, upon the current difference is less than the preset threshold, the channel current length of the thin film transistor of the second sub-pixel 21 is obtained as the channel target length of the thin film transistor of the second sub-pixel 21. At Sub-step S2023, the channel current width-to-length ratio of the thin film transistor of the second sub-pixel is obtained based on the channel current length of the thin film transistor of the second sub-pixel 21 as the channel target width-to-length ratio of the thin film transistor of the second sub-pixel 21.

Specifically, the preset threshold may be 0 or may not be 0, as long as the channel length of the thin film transistor of the second sub-pixel 21 is adjusted so that a second current flowing through the driving thin film transistor of the second sub-pixel 21 does not cause a significant luminance difference between the first sub-pixel 11 and the second sub-pixel 21. Therefore, under the condition that the current difference may make the luminance of the second sub-pixel 21 tend to be same as the luminance of the first sub-pixel 11, the channel length of the thin film transistor of the second sub-pixel 21 is the target channel length of the thin film transistor of the second sub-pixel 21.

In an embodiment of the present application, the channel target length of the thin film transistor of the second sub-pixel 21 is larger than the channel initial length of the thin film transistor of the second sub-pixel 21. That is, by slightly increasing the channel length of the driving transistor in the second sub-pixel 21 in the second display region 20, the channel length-width ratio thereof is reduced and the threshold voltage thereof is increased, the current flowing through the second sub-pixel 21 in the second display region 20 is reduced, and the luminance of the second display region 20 tends to be same as that of the first sub-pixel 11 in the first display region 10, thereby improving the non-uniform luminance of the display panel.

In an embodiment of the present application, by detecting the first current value of the first sub-pixel 11 in the first display region 10 of the reference display panel and the second current value of the second sub-pixel 21 in the second display region 20 of the reference display panel, the variation of the channel width-to-length ratio of the thin film transistor of the second sub-pixel 21 is calculated. That is, the variation of the current flowing through the thin film transistor of the second sub-pixel 21 when the second display region 20 of the reference display panel is effect due to a coupling effect is determined. The channel target width-to-length ratio is calculated based on the difference between the channel initial width-to-length ratio and the variation of the channel width-to-length ratio. The channel length and/or the channel width of the thin film transistor of the second sub-pixel 21 is determined according to the channel target width-to-length ratio. The thin film transistor of the second sub-pixel 21 in the second display region 20 of the display panel is remanufactured according to the determined channel length and/or the determined channel width, so that the channel width-to-length ratio of the thin film transistor of the second sub-pixel 21 in the second display region 20 of the display panel is adjusted. The luminance of the second display region 20 is reduced by adjusting the channel width-to-length ratio, so that the luminance of the first display region 10 and the luminance of the second display region 20 are more uniform with the narrow frame technology, thereby improving the display effect of the display panel.

FIG. 13 is a flowchart of sub-steps in Step S40 of FIG. 6 according to an embodiment of the present application. Step S40 includes sub-steps S3011, S3012, and S3013.

At Sub-step S3011, a plurality of channel target width-to-length ratios of the thin film transistor of the second sub-pixel 21 at the respective ones of 256 gray scales are respectively obtained.

In an embodiment of the present application, the channel target width-to-length ratios of the thin film transistor of the second sub-pixel 21 at the gray scale of 0 to 255 are respectively obtained by simulation tests. Specifically, the target channel lengths of the thin film transistor of the second sub-pixel 21 at the gray scale of 0 to 255 are respectively obtained.

At Sub-step S3012, a proportion of the number of each of the channel target width-to-length ratios with respect to the total number of the plurality of channel target width-to-length ratios are determined, respectively.

In an embodiment of the present application, the obtained target channel lengths of the thin film transistor of the second sub-pixel 21 at respective gray scales are collected and compared to obtain a proportion of the number of respective target channel length values with respect to the number of all target channel length values.

At Sub-step S3013, a thin film transistor of the second sub-pixel 21 is disposed according to one of the channel target width-to-length ratios with a greatest proportion.

In an embodiment of the present application, the value of the target channel length with the greatest proportion is selected from the calculated values of the target channel length of the thin film transistor of the second sub-pixel 21 at respective gray scales as the value of the channel target length of the thin film transistors of the final second sub-pixels 21. With such an arrangement, the channel target length value of the thin film transistor of the second sub-pixel 21 may be provided so that the second current value tends to be same as the first current value at as many gray scales as possible.

Further, after the channel length and the channel width of the thin film transistor of each second sub-pixel 21 are determined, the thin film transistor of each second sub-pixel 21 in the second display region 20 is manufactured according to the determined channel length and the determined channel width during the display panel is manufactured.

FIG. 14 is a flowchart of sub-steps in Step S40 of FIG. 6 according to an embodiment of the present application. Step S40 includes Sub-steps S3021, S3022, and S3023.

At Sub-step S3021, a plurality of channel target width-to-length ratios of the thin film transistor of the second sub-pixel 21 at the respective ones of 256 gray scales are obtained, respectively;

At Sub-step S3022, a plurality of differences between respective ones of the channel target width-to-length ratios and a corresponding one of the channel initial width-to-length ratios of the thin film transistor of the second sub-pixel at respective ones of 256 gray scales is obtained, to obtain an average value of the plurality of the differences;

At Sub-step S3023, a thin film transistor of the second sub-pixel 21 of the target display panel is manufactured based on a channel target width-to-length ratio calculated from the average value of the differences and the channel initial width-to-length ratio.

On the other hand, the present application provides a display panel, which is manufactured by the method of manufacturing the display panel as described above. Specifically, the display panel includes a first display region 10 and a second display region 20. Each of the first display region 10 and the second display region 20 includes power supply lines 30 and signal lines 40. A plurality of first sub-pixels 11 are disposed in the first display region 10 and electrically connected to the power supply lines 30 and the signal lines 40, respectively. A plurality of second sub-pixels 21 are disposed in the second display region 20 and electrically connected to the power supply lines 30 and the signal lines 40, respectively. In the second display region 20, the orthographic projection of the signal line 40 at least partially overlaps the orthographic projection of the power supply line 30. A current difference between a first current value of a current flowing through the thin film transistor (e.g., T2 in FIG. 3) of the first sub-pixel 11 and a second current value of a current flowing through the thin film transistor (e.g., T2*  in FIG. 4) of the second sub-pixel 21 is less than a preset threshold during operation of the display panel.

In an embodiment of the present application, the channel width-to-length ratio of the thin film transistor of the first sub-pixel 11 is different from that of the second sub-pixel 21.

In an embodiment of the present application, the channel length of the thin film transistor of the second sub-pixel 21 is greater than the channel length of the thin film transistor of the first sub-pixel 11.

The present application provides a display panel and a method of manufacturing a display panel. The channel width-to-length ratio of a thin film transistor of a second sub-pixel 21 is adjusted to control a second current value of a current flowing through the second sub-pixel 21, the method of manufacturing the display panel may improve the non-uniform luminance of the display panel and improve the display effect.

The principles and implementations of the present application are described above by some embodiments. The description of the above embodiments is merely provided to help understand the present application. Variations will occur to those skilled in the art based on the teachings of the present application. Thus, the presented description should not be construed as limiting the present application.

What is claimed is:

1. A display panel having a first display region and a second display region, wherein power supply lines and signal lines are arranged in each of the first display region and the second display region, a plurality of first sub-pixels are disposed in the first display region, and each of the first sub-pixels is electrically connected to one of the power supply lines and one of the signal lines, a plurality of second sub-pixels are disposed in the second display region, and each of the second sub-pixels is electrically connected to one of the power supply lines and one of the signal lines, in the second display region, each of the signal lines at least partially overlaps with each of the power supply lines in a plane view of the display panel, and each of the first sub-pixels comprises a first thin film transistor, each of the second sub-pixels comprises a second thin film transistor, and the first thin film transistor and the second thin film transistor are configured such that, when the display panel is in operation, a current difference between a first value of a first current flowing through the first thin film transistor and a second value of a second current flowing through the second thin film transistor is less than a preset threshold.

2. The display panel of claim 1, wherein a ratio of a first width of a first channel of the first thin film transistor to a first length of the first channel is not equal to a ratio of a second width of a second channel of the second thin film transistor to a second length of the second channel.

3. The display panel of claim 2, wherein the second width is less than the first width.

4. The display panel of claim 2, wherein the second length is greater than the first length.

5. The display panel of claim 4, wherein the second width is equal to the first width.

6. The display panel of claim 4, wherein the first value is equal to the second value.

7. A method of manufacturing a display panel, comprising:

providing a reference display panel having a first display region and a second display region adjacent to each other, wherein a plurality of first sub-pixels each comprising a first thin film transistor are disposed in the first display region, and a plurality of second sub-pixels each comprising a second thin film transistor are disposed in the second display region;

obtaining, when the reference display panel is in operation, a first value of a first current flowing through the first thin film transistor and a second value of a second current flowing through the second thin film transistor, and calculating a current difference between the first value and the second value;

obtaining a target ratio of a second width of a second channel of the second thin film transistor to a second length of the second channel by adjusting a ratio of the second width to the second length so that the current difference is less than a preset threshold; and manufacturing a target display panel having a target first display region and a target second display region adjacent to each other, so that a ratio of a target second width of a target second channel of a target second thin film transistor of each of target second sub-pixels disposed in the target second display region to a target second length of the target second channel is equal to the target ratio.

8. The method of claim 7, wherein the obtaining of the target ratio comprises:

obtaining the target ratio by adjusting the second length so that the current difference is less than the preset threshold.

9. The method of claim 7, wherein the manufacturing of the target display panel comprises:

obtaining a plurality of target ratios of the second width to the second length respectively at a plurality of gray scales;

determining most ones of the target ratios having a same value; and manufacturing the target display panel, so that the ratio of the target second width to the target second length is equal to one of the most ones of the target ratios.

10. The method of claim 7, wherein the manufacturing of the target display panel comprises:

obtaining a plurality of target ratios of the second width to the second length respectively at a plurality of gray scales;

obtaining, for each of the target ratios, a variation of the each of the target ratios from an initial ratio of the second width to the second length corresponding to the each of the target ratios, to obtain a plurality of variations, and obtaining an average value of the plurality of variations; and manufacturing the target display panel, so that the ratio of the target second width to the target second length is equal to a target ratio calculated from the initial ratio of the second width to the second length and the average value.

\* \* \* \* \*